(12) United States Patent
Johnson

(10) Patent No.: US 7,149,824 B2
(45) Date of Patent: Dec. 12, 2006

(54) DYNAMICALLY SETTING BURST LENGTH OF MEMORY DEVICE BY APPLYING SIGNAL TO AT LEAST ONE EXTERNAL PIN DURING A READ OR WRITE TRANSACTION

(75) Inventor: Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 10/191,290

(22) Filed: Jul. 10, 2002

(65) Prior Publication Data

US 2004/0010637 A1  Jan. 15, 2004

(51) Int. Cl.
G06F 13/28 (2006.01)
G06F 12/06 (2006.01)
G11C 7/00 (2006.01)
G11C 8/00 (2006.01)

(52) U.S. Cl. ............... 710/35; 710/5; 711/104; 711/105; 711/106; 711/165; 711/170; 711/127; 711/212; 365/189.05; 365/201; 365/203; 365/203.06; 365/204; 365/233; 365/236

(58) Field of Classification Search ............. 710/35.5; 711/104, 105, 106, 127, 170, 212, 165; 365/201, 365/203, 233, 203.06, 204, 189.05, 236
See application file for complete search history.

(56) References Cited

U.S. PATENT DOCUMENTS

| | | | | |
|---|---|---|---|---|
| 5,598,376 A | * | 1/1997 | Merritt et al. | 365/230.06 |
| 5,717,639 A | * | 2/1998 | Williams et al. | 365/189.05 |
| 5,896,404 A | | 4/1999 | Kellogg et al. | |
| 5,918,072 A | | 6/1999 | Bhattacharya | |
| 5,946,269 A | * | 8/1999 | Jang | 365/236 |
| 6,088,760 A | * | 7/2000 | Walker et al. | 711/104 |
| 6,324,116 B1 | * | 11/2001 | Noh et al. | 365/230.05 |
| 6,327,175 B1 | * | 12/2001 | Manapat et al. | 365/154 |
| 6,339,817 B1 | * | 1/2002 | Maesako et al. | 711/165 |
| 6,414,890 B1 | * | 7/2002 | Arimoto et al. | 365/201 |
| 6,483,772 B1 | * | 11/2002 | Ozawa et al. | 365/233 |
| 6,580,659 B1 | * | 6/2003 | Roohparvar | 365/233 |
| 6,640,266 B1 | * | 10/2003 | Arcoleo et al. | 710/35 |
| 6,651,134 B1 | * | 11/2003 | Phelan | 711/104 |
| 6,665,222 B1 | * | 12/2003 | Wright et al. | 365/203 |

OTHER PUBLICATIONS

Micron Technology Inc. data sheet: "128Mb: x4,x8, x16 SDRAM"; © 1999, Micron Technology, Inc., pp. 1-55.

* cited by examiner

Primary Examiner—Tammara Peyton
(74) Attorney, Agent, or Firm—Dickstein Shapiro LLP

(57) ABSTRACT

One or more external control pins and/or addressing pins on a memory device are used to set one or both of a burst length and burst type of the memory device.

25 Claims, 7 Drawing Sheets

| x4 | x8 | x16 | | | | x16 | x8 | x4 |
|---|---|---|---|---|---|---|---|---|
| VDD | VDD | VDD | 1• | | 66 | VSS | VSS | VSS |
| NC | DQ0 | DQ0 | 2 | | 65 | DQ15 | DQ7 | NC |
| VDDQ | VDDQ | VDDQ | 3 | | 64 | VSSQ | VSSQ | VSSQ |
| NC | NC | DQ1 | 4 | | 63 | DQ14 | NC | NC |
| DQ0 | DQ1 | DQ2 | 5 | | 62 | DQ13 | DQ6 | DQ3 |
| VSSQ | VSSQ | VSSQ | 6 | | 61 | VDDQ | VDDQ | VDDQ |
| NC | NC | DQ3 | 7 | | 60 | DQ12 | NC | NC |
| NC | DQ2 | DQ4 | 8 | | 59 | DQ11 | DQ5 | NC |
| VDDQ | VDDQ | VDDQ | 9 | | 58 | VSSQ | VSSQ | VSSQ |
| NC | NC | DQ5 | 10 | | 57 | DQ10 | NC | NC |
| DQ1 | DQ3 | DQ6 | 11 | | 56 | DQ9 | DQ4 | DQ2 |
| VSSQ | VSSQ | VSSQ | 12 | | 55 | VDDQ | VDDQ | VDDQ |
| NC | NC | DQ7 | 13 | | 54 | DQ8 | NC | NC |
| NC | NC | NC | 14 | | 53 | NC | NC | NC |
| VDDQ | VDDQ | VDDQ | 15 | | 52 | VSSQ | VSSQ | VSSQ |
| NC | NC | LDQS | 16 | | 51 | UDQS | DQS | DQS |
| NC | NC | NC | 17 | | 50 | DNU | DNU | DNU |
| VDD | VDD | VDD | 18 | | 49 | VREF | VREF | VREF |
| NC | DNU | DNU | 19 | | 48 | VSS | VSS | VSS |
| NC | NC | LDM | 20 | | 47 | UDM | DM | DM |
| WE# | WE# | WE# | 21 | | 46 | CK# | CK# | CK# |
| CAS# | CAS# | CAS# | 22 | | 45 | CK | CK | CK |
| RAS# | RAS# | RAS# | 23 | | 44 | CKE | CKE | CKE |
| CS# | CS# | CS# | 24 | | 43 | NC | NC | NC |
| NC | NC | NC | 25 | | 42 | A12 | A12 | A12 |
| BA0 | BA0 | BA0 | 26 | | 41 | A11 | A11 | A11 |
| BA1 | BA1 | BA1 | 27 | | 40 | A9 | A9 | A9 |
| A10/AP | A10/AP | A10/AP | 28 | | 39 | A8 | A8 | A8 |
| A0 | A0 | A0 | 29 | | 38 | A7 | A7 | A7 |
| A1 | A1 | A1 | 30 | | 37 | A6 | A6 | A6 |
| A2 | A2 | A2 | 31 | | 36 | A5 | A5 | A5 |
| A3 | A3 | A3 | 32 | | 35 | A4 | A4 | A4 |
| VDD | VDD | VDD | 33 | | 34 | VSS | VSS | VSS |

DYNAMICALLY SETTING BURST LENGTH OF MEMORY DEVICE BY APPLYING SIGNAL TO AT LEAST ONE EXTERNAL PIN DURING A READ OR WRITE TRANSACTION

FIELD OF THE INVENTION

The present invention relates to a method and apparatus which permits modification of the burst length of data in a memory device.

BACKGROUND OF THE INVENTION

A burst mode is known to be used in some memory devices to increase the speed of reading and writing data from and to the memory. Burst mode operation allows reads or writes from or to consecutive memory core locations at high speeds. When a burst mode is not implemented, a memory storage device uses one clock cycle to activate a row, giving the row address, and another clock cycle for column addressing. The READ or WRITE command is given with the column address on separate command lines.

In the clock cycle(s) following the addressing/command cycles, data is transferred from or to a memory device. For example, 4 eight bit data bytes being read from or written to a DDR SDRAM requires one clock cycle to decode a each of the four column addresses. The first column address is issued with the READ or WRITE command with the subsequent column address being decoded internally on the DRAM device freeing up the command bus for other uses.

In addition, by eliminating column decoding time, the command bus is free to reduce latency during back intervening. Accordingly, a burst mode operation provides relatively high data transfer rates and significantly reduces the latency involved in a memory transfer.

The burst mode is generally controlled by setting one or more bits in a mode register provided within a memory device. As shown in FIG. 1, which depicts one exemplary memory device mode register, data within the mode register 100 controls a variety of different chip functions. Bits 13 and 14 of mode register 100 are used to select between a base mode register and an extended mode register; bits 7 through 12 of mode register 100 determine the operating mode of the memory device; bits 4–6 of mode register 100 determine the column address strobe ("CAS") latency; bit 3 of mode register 100 determines whether the burst type is sequential or interleaved; and, bits 0–2 of mode register 100 determine the burst length.

The burst length determines the maximum number of consecutive column locations that can be accessed for a given READ or WRITE command without the need to use clock cycles to transfer subsequent intervening column addresses. As shown in tables 110 and 120, burst lengths of 2, 4 or 8 bytes can be selected for each of the sequential and interleaved burst types which is set by bit position 3.

Mode register 100 is programmed by a CPU or memory controller using a MODE REGISTER SET command and retains the set information until it is programmed again, or the memory device loses power. The mode register must be programmed while all memory cores are idle and no data bursts are in progress, and the memory controller or CPU must wait a specified time before initiating a memory access operation subsequent to programming.

A memory device which allows dynamic programming of burst length would be desirable and would permit faster adjustment of the burst length.

SUMMARY OF THE INVENTION

The present invention mitigates the problems associated with current DRAM devices and provides a unique method and system of allowing a user to dynamically define burst length.

In accordance with an exemplary embodiment of the present invention, control pins provided on a memory storage device are used to set burst length. In addition, a control pin on the memory storage device can be used to determine the burst type. Using control pins to set burst length and type allows the burst length to be set while the memory cores are in use and without waiting after changing the burst length and/or type before initiating a memory access operation.

In another exemplary embodiment of the present invention, the address pins that are not used during column addressing are used for setting the burst length and/or burst type. This embodiment also allows the burst length and/or burst type to be set while the memory cores are in use and without waiting after changing the burst length and/or type before initiating a memory access operation. The burst length does not necessarily have to be set on active commands, READs or WRITEs.

BRIEF DESCRIPTION OF THE DRAWINGS

The above and other features and advantages of the invention will be more readily understood from the following detailed description of the invention which is provided in connection with the accompanying drawings.

FIG. 2 is an illustration of the layout of control pins in a preferred embodiment of the present invention;

DETAILED DESCRIPTION OF PREFERRED EMBODIMENTS

Figure 1:
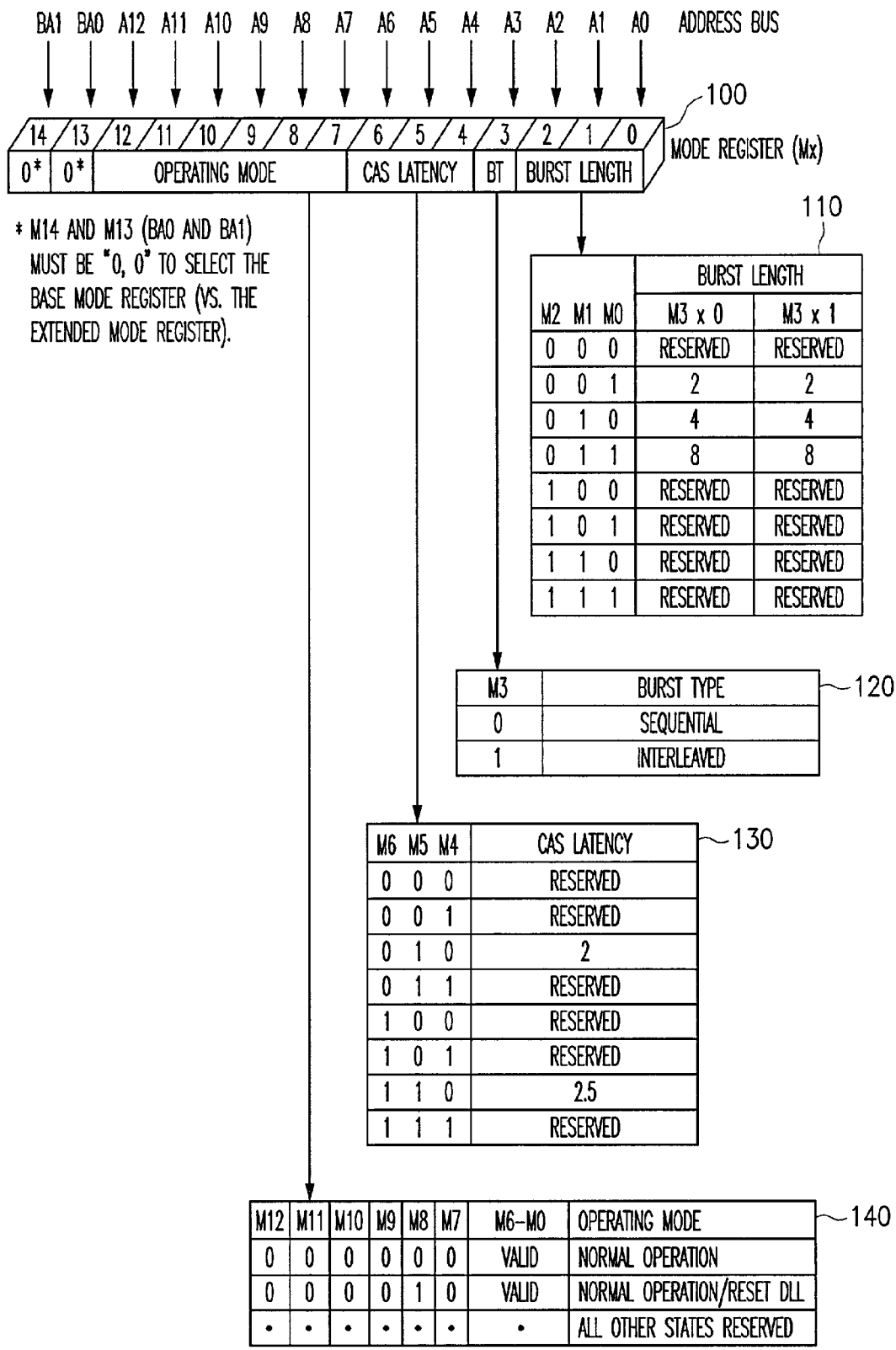
FIG. 1 is an illustration of a conventional memory device mode register and its contents.

In the following detailed description, reference is made to the accompanying drawings which form a part hereof, and in which is shown by way of illustration specific embodiments in which the invention may be practiced. These embodiments are described in sufficient detail to enable those skilled in the art to make and use the invention, and it is to be understood that structural changes may be made and equivalent structures substituted for those shown without departing from the spirit and scope of the present invention.

In accordance with an exemplary embodiment of the present invention, external pins provided on a memory storage device are used to dynamically set the burst length or hard set the burst length. An exemplary memory device 200 which may employ the invention is shown in FIG. 2, and is a 256 Mb double data rate synchronous DRAM (DDR SDRAM). As can be seen, memory device 200 has a plurality of control pins (for example, pins 21, 22, 23, 24 are control pins). While the following description of a preferred embodiment of the present invention is described with reference to a 256 Mb DDR SDRAM, the present invention can be implemented with any memory storage device having external pins.

Memory storage device 200 can be configured to use a single external pin to toggle between two possible burst lengths or a plurality of external pins if a larger number of burst lengths is desired. In most memory chip designs, there are many external pins that are not connected ("NC") and can be turned into control pins. As a result, the present invention can be easily incorporated into most chip designs. One or more of the NC pins can be used as burst length toggle pins. For example, if two possible burst lengths are desired, pin 17 of memory storage device 200, which is labeled NC in FIG. 2, can be used. If the two possible burst lengths are 4 bytes and 8 bytes, then when pin 17 is high, the burst length is e.g. 4 bytes; when pin 17 is low, the burst length is e.g. 8 bytes, or vice versa. If a burst length of 2 bytes is also desirable, NC pin 25 can also be used as up to four burst lengths can be programmed with two control pins. Although the description discusses several different burst lengths, the number of dynamically defined burst lengths is determined based on the number of available external pins.

Figure 3A:
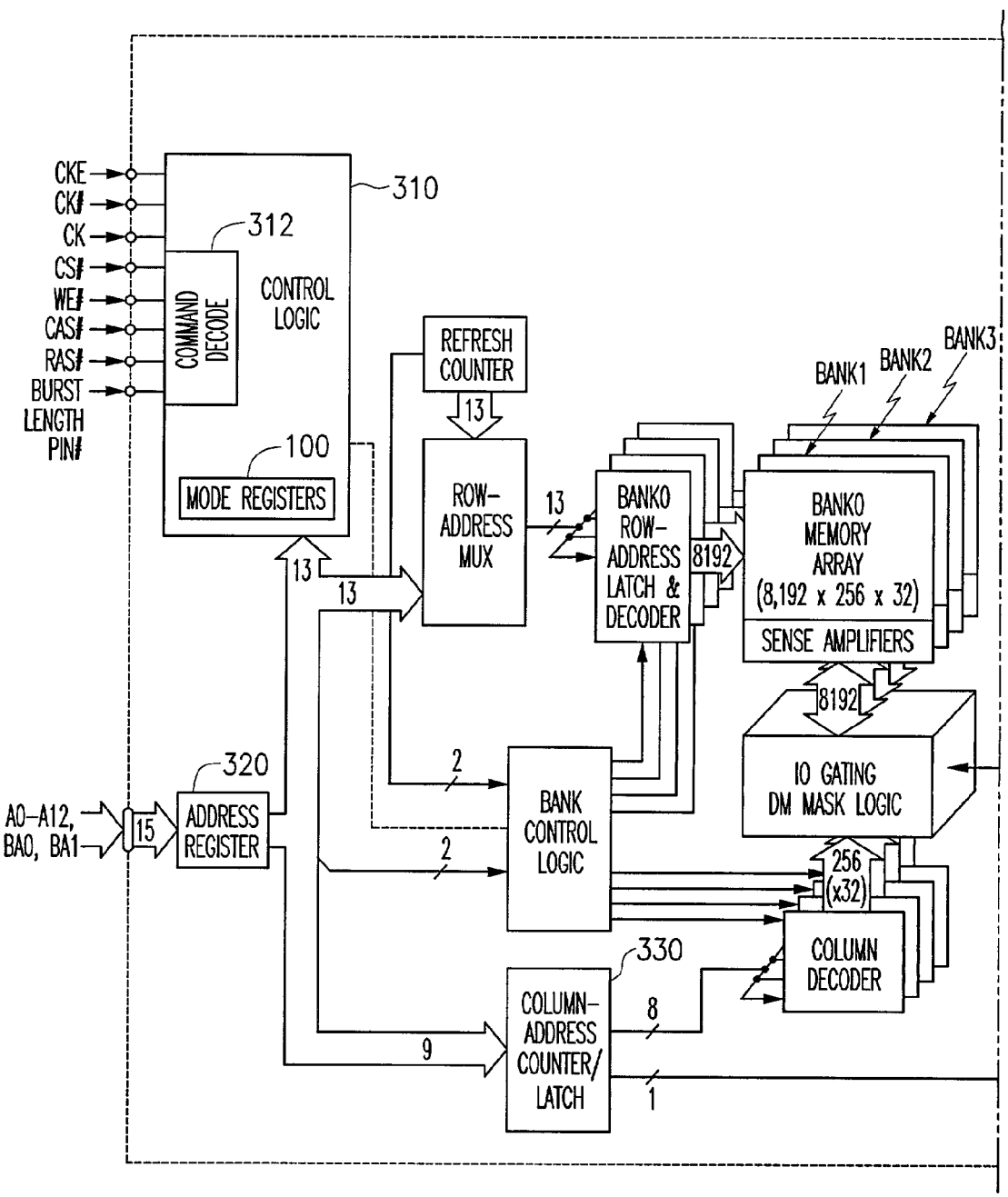
FIG. 3 is an illustration of a block diagram of a 256M×16 DDR SDRAM implementing the present invention.
Figure 3B:
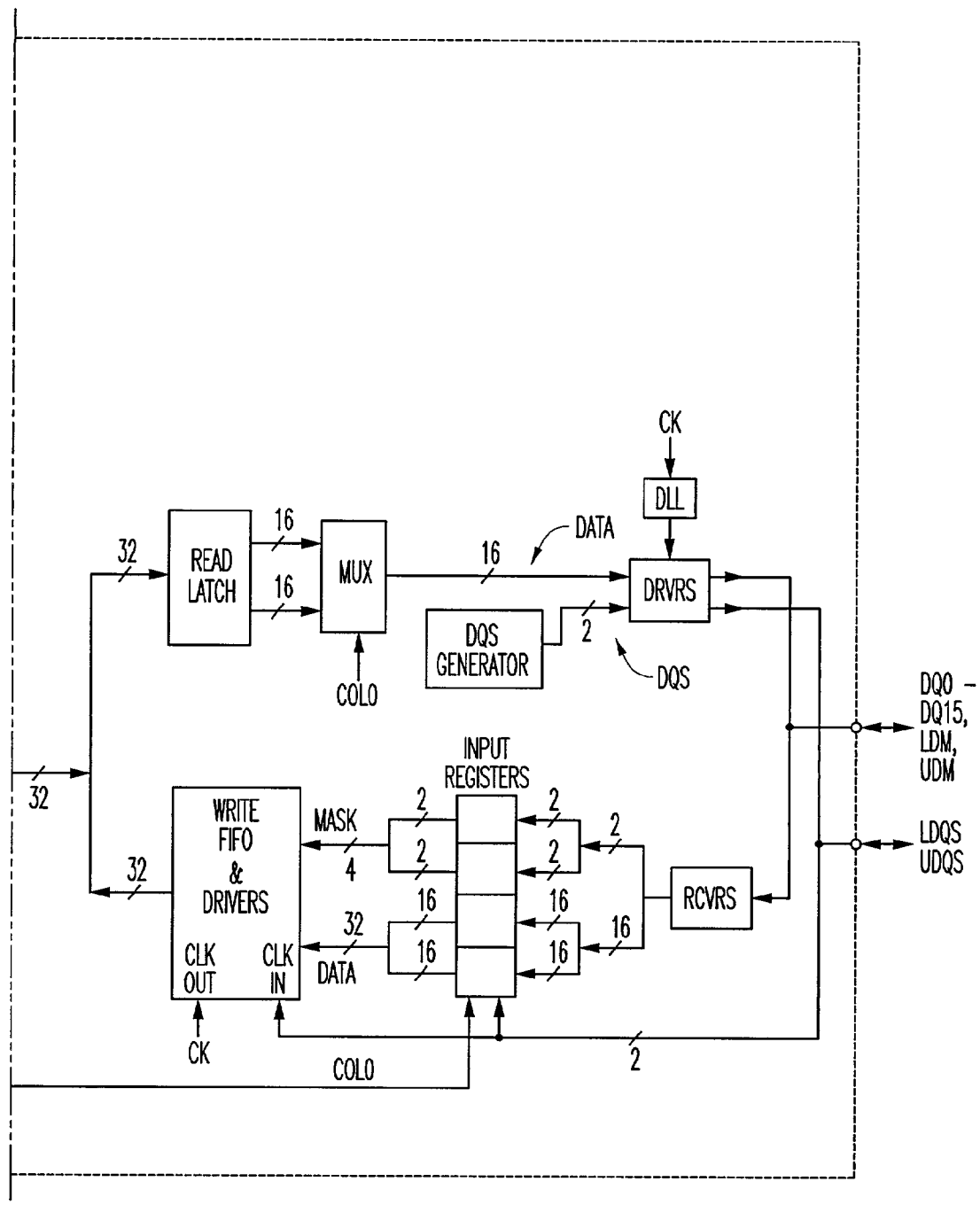
Figure 4:
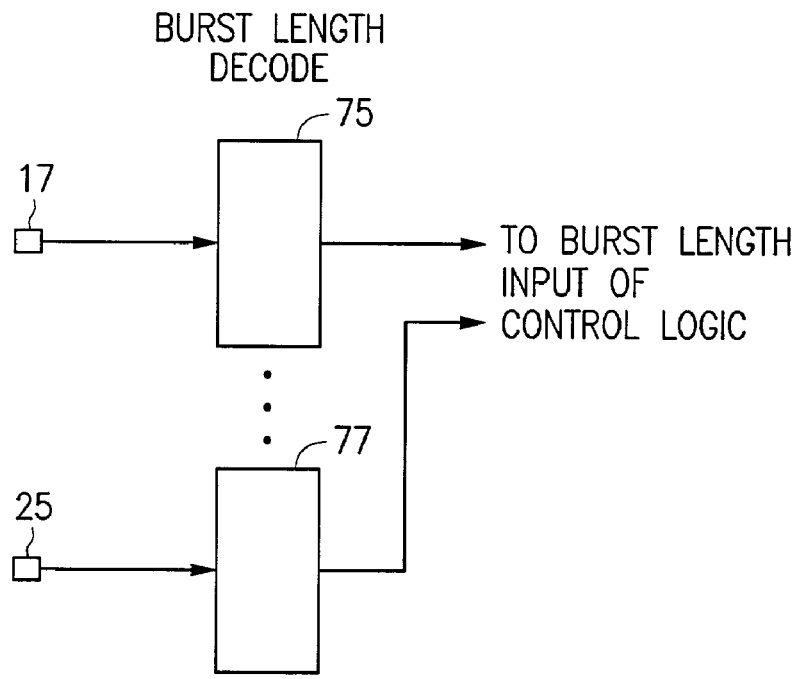
FIG. 4 is an illustration of a burst length latch in a preferred embodiment of the present invention.

FIG. 3 is a block diagram of the FIG. 2 256M×16 DDR SDRAM. Control logic 310, as shown in FIG. 3, receives a data signal on the burst length input pin (e.g. external pin 17) as an input. One or more external pins can be used to input burst length data. A command decode circuit 312, which is part of the memory device control logic 310, determines what the burst length is based on the data signals applied to the external burst control pin(s). For example, if the external burst pin is a single pin 17 (i.e. for 2 possible burst lengths), the command decode determines if the voltage on pin 17 is set to Vcc indicating a first burst length or Vss indicating a second burst length. The status of the one or more burst length pins sets appropriate internal burst codes (FIG. 4, decode circuits 75, 77) within the command and decode circuit 312.

Implementation of the present invention requires very little internal change to existing memory devices. Thus, where the burst length would previously be output from mode register 100 (FIG. 1) to other circuits within control logic 310 (FIG. 2) to set burst length, in the present invention, it is output to the other circuits from one or more decode circuits or data latches 75, 77 (FIG. 4) within command decode circuit 312 which now contains this data. In both the conventional memory device of FIG. 2 and one in accordance with the present invention, the burst length data is used by the control logic 310 to set burst length. Accordingly, nothing outside of the control logic 310 needs to be changed to implement the present invention, and very little change within control logic 310 is required.

By using external control pins to control the burst length instead of the mode register 100, the burst length can be controlled dynamically from the exterior of the memory device 100. The burst length also can be changed simultaneously with a READ or WRITE command.

In addition to using the external control pins to determine the burst length, the burst type can also be set using external control pins. This allows the burst type to also be set dynamically. As with using the external control pins to adjust burst length, using the external control pins to determine the burst type can be easily incorporated into most existing memory storage device designs by using another one of the NC pins. For example, referring to FIG. 2, external pin 53 could be used to determine burst type of the memory device 200. If burst type pin 53 is e.g. high, the burst type is interleaved; if burst type pin 53 is e.g. low, the burst type is sequential.

The same type of modifications necessary to change control of the burst length from mode register 100 to the external pin 17 are necessary to change control of the burst type from mode register 100 to external pin 53. Thus, a decode circuit 79 (FIG. 5) within the column decode and burst counter circuit 312 receives a data signal applied to external pin 53 and the output of this circuit 79 goes to the same circuitry within the control logic 312 which processes burst type data previously set in the mode register 100. Thus, controlling burst type with an external control pin only requires a small internal change within control logic 310.

Another exemplary embodiment of the present invention uses the address pins to set burst length and/or burst type. As shown in FIG. 3, thirteen external pins (e.g. A0–A12) are input into address register 320 for addressing. Both row and column addresses use the same 13 pins. During column addressing, however, only 10 (A0, . . . , A9) of the 13 pins are needed. The remaining three pins (A10 . . . A12) can be used to determine burst length and/or burst type.

Figure 5:
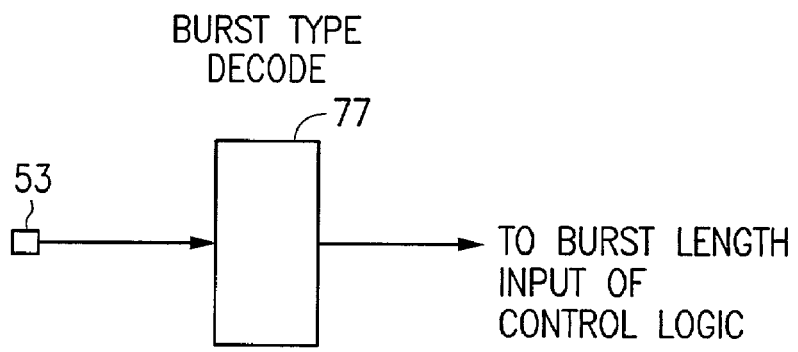
FIG. 5 is an illustration of a burst type latch in a preferred embodiment of the present invention.
Figure 6:
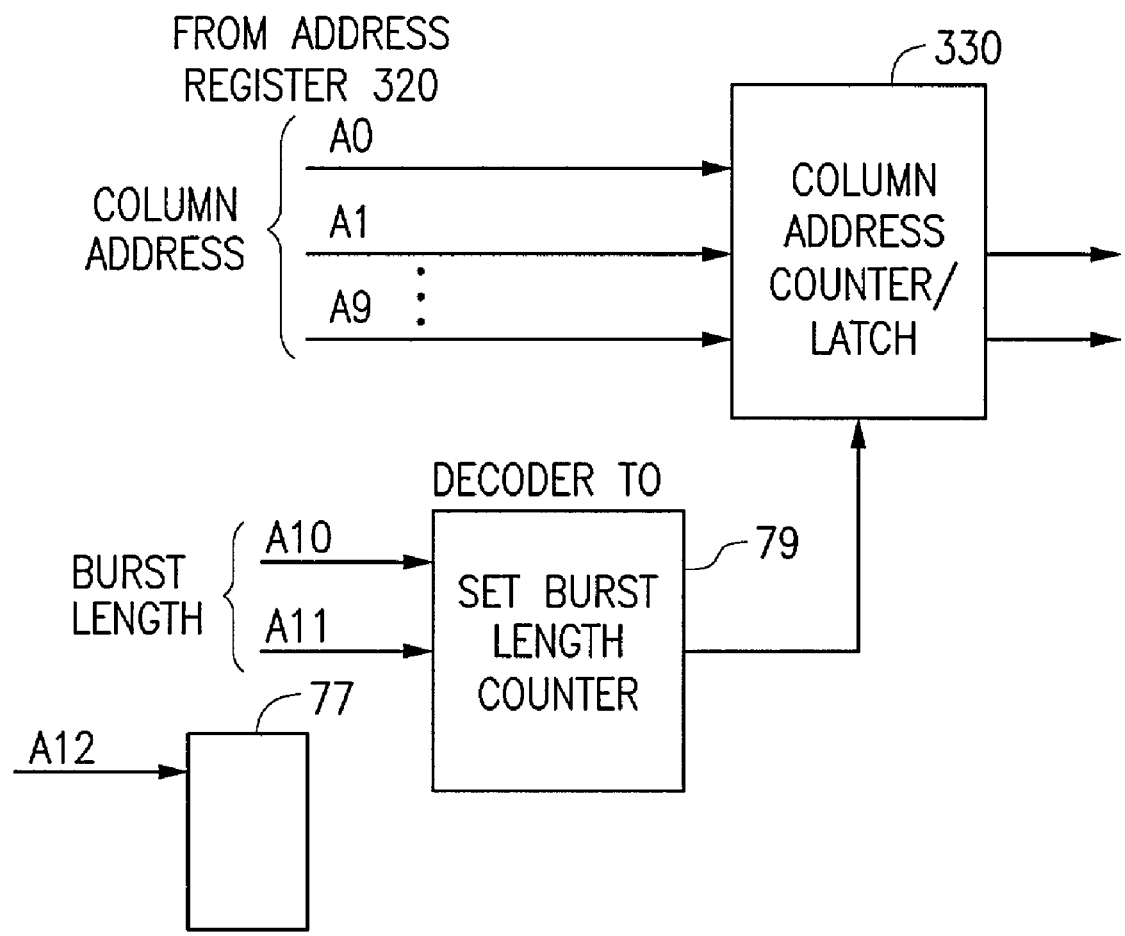
FIG. 6 is an illustration of a column address counter/latch in an exemplary embodiment of the present invention.

In this embodiment burst length data is applied to one or more of address pins A10 . . . A12. FIG. 6 shows two such address lines (A10, A11) being used for this purpose. A decode circuit 81 decodes this data and supplies the burst length information to the column address counter/latch 330 (FIG. 3). If less than all of the unused address lines are required for setting burst length, any remaining lines, e.g. A12 in FIG. 6, can be used to set burst type decode circuit 77 (FIG. 5).

It should be noted that although FIG. 6 shows a decoder 81 for the burst length signal(s) which is external to the column address counter/latch 330, decoder 81 may also be incorporated within the column address counter/latch 330.

The mode register for a memory device implementing embodiments of the present invention does not require the bit positions A0–A2 illustrated in mode register 100 for setting burst length and/or bit position A3 for setting burst type and can therefore be made shorter in length, or the unused bit positions may be used for other functions.

The invention may be used in many types of memory devices in addition to the DDR SDRAM memory device illustrated in FIGS. 2 and 3.

Figure 7:
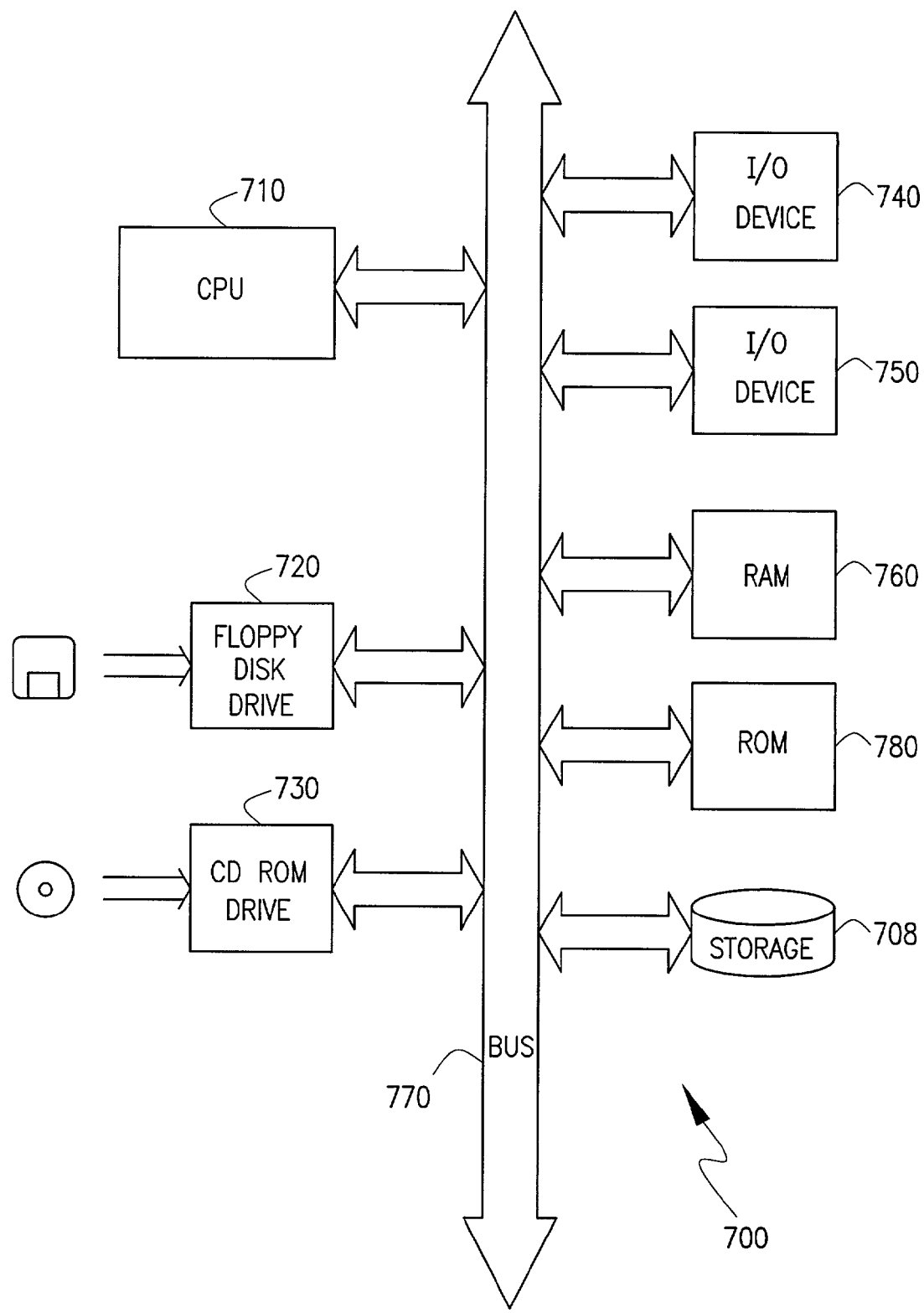
FIG. 7 illustrates a processor system which includes electronic devices containing the invention.

FIG. 7 shows a processor system, such as, for example, a computer system in which the invention may be used. The processor system generally comprises a central processing unit (CPU) 710, for example, a microprocessor, that communicates with one or more input/output (I/O) devices 740, 750 over a bus 770. The system 700 also includes random access memory (RAM) 760, a read only memory (ROM) 780 and, in the case of a computer system may include a permanent data storage device 708 and peripheral devices such as a floppy disk drive 720 and a compact disk (CD) ROM drive 730 which also communicate with CPU 710 over the bus 770. The random access memory (RAM) 760 may incorporate external pin control of burst length and/or burst type in accordance with the invention. In addition, one or more of memory devices 760, 780 may be fabricated as an integral part with CPU 710. While FIG. 7 represents one processor system architecture, many others are also possible.

While the invention has been described with reference to an exemplary embodiments various additions, deletions, substitutions, or other modifications may be made without departing from the spirit or scope of the invention. Accord-

What is claimed as new and desired by Letters Patent of the United States is:

1. A method of setting burst length in a memory device comprising:
   applying a signal to at least one external pin of said memory device during a read transaction or during a write transaction of a main memory of said memory device, where said memory device is adapted to receive said signal during read transactions or during write transactions of said main memory of said memory device; and
   setting a burst length of said main memory for said read transaction or said write transaction in response to said signal, where burst length is the maximum number of consecutive memory locations that can be accessed for a given READ command or WRITE command without the need to transfer intervening memory location addresses.

2. The method of claim 1 wherein said at least one external pin is at least one dedicated pin for setting burst length.

3. The method of claim 1 wherein said at least one external pin is a pin used for at least one function of said memory device in addition to setting burst length.

4. The method of claim 3 wherein said at least one external pin is an addressing pin of said memory device.

5. The method of claim 1, wherein said at least one external pin is a plurality of external pins.

6. A memory device comprising:
   a main memory;
   a plurality of external pins; and
   a logic control circuit for controlling operations of said main memory, said logic control circuit being responsive to signals applied during a read transaction or during a write transaction of said main memory on at least one of said external pins to set a burst length of said memory device, where burst length is the maximum number of consecutive memory locations that can be accessed for a given READ or WRITE command without the need to transfer intervening memory location addresses.

7. The memory device of claim 6, wherein said logic control circuit sets said burst length in response to signals applied to a plurality of said external pins.

8. The memory device of claim 6, wherein said at least one external pin is a pin dedicated to controlling burst length.

9. The memory device of claim 8, wherein said at least one external pin is a plurality of dedicated external pins.

10. The memory device of claim 6, wherein said at least one external pin is a pin used for at least one function of said memory device in addition to setting burst length.

11. The memory device of claim 10, wherein said at least one external pin is an addressing pin of said memory device.

12. A memory device comprising:
   a main memory;
   a plurality of address pins; and
   a logic control circuit for controlling operations of said main memory, said logic control circuit being responsive to signals applied during a read transaction or during a write transaction of said main memory on at least one of said external pins to set a burst length of said memory device, where burst length is the maximum number of consecutive memory locations that can be accessed for a given READ or WRITE command without the need to transfer intervening memory location addresses.

13. The memory device of claim 12, where said logic circuit adjusts said burst length in response to signals applied to a plurality of said address pins.

14. The memory device of claim 12, further comprising:
   a decoder, said decoder being responsive to signals on said at least one addressing pin for decoding a burst length.

15. The memory device of claim 12, wherein said addressing operation is a column addressing operation.

16. A processor system comprising:
   a processor; and
   a memory device coupled to exchange data with said processor, said memory device comprising a main memory and responsive to signals applied during a read transaction or during a write transaction of said main memory on at least one external pin to set a burst length of said main memory, where burst length is the maximum number of consecutive memory locations that can be accessed for a given READ or WRITE command without the need to transfer intervening memory location addresses.

17. The processor system of claim 16, wherein said memory device sets said burst length in response to signals applied to a plurality of external pins.

18. The processor system of claim 16, wherein said at least one external pin is at least one dedicated pin for setting burst length.

19. The processor system of claim 16, wherein said at least one external pin is a pin used for at least one function of said memory device in addition to setting burst length.

20. The processor system of claim 19, wherein said at least one external pin is an addressing pin of said memory device.

21. A processor system comprising:
   a processor; and
   a memory device coupled to exchange data with said processor, said memory device comprising a main memory and responsive to signals applied during a read transaction or during a write transaction of said main memory on at least one address pin to set a burst length of said main memory, where burst length is the maximum number of consecutive memory locations that can be accessed for a given READ or WRITE command without the need to transfer intervening memory location addresses.

22. The processor system of claim 21, where said memory device sets said burst length in response to signals applied to a plurality of address pins.

23. The processor system of claim 21, wherein said addressing operation is a column addressing operation.

24. A method of setting burst length in a memory device comprising:
   applying a signal to at least one external pin of said memory device during a read transaction of a main memory of said memory device, where said memory device is adapted to receive said signal during read transactions of said main memory of said memory device; and
   setting a burst length of said main memory for said read transaction in response to said signal, where burst length is the maximum number of consecutive memory locations that can be accessed for a given READ command without the need to transfer intervening memory location addresses.

25. A method of setting burst length in a memory device comprising:

applying a signal to at least one external pin of said memory device during a write transaction of a main memory of said memory device, where said memory device is adapted to receive said signal during write transactions of said main memory of said memory device; and setting a burst length of said main memory for said write transaction in response to said signal, where burst length is the maximum number of consecutive memory locations that can be accessed for a given WRITE command without the need to transfer intervening memory location addresses.

* * * * *

UNITED STATES PATENT AND TRADEMARK OFFICE
CERTIFICATE OF CORRECTION

| | | |
|---|---|---|
| PATENT NO. | : 7,149,824 B2 | Page 1 of 1 |
| APPLICATION NO. | : 10/191290 | |
| DATED | : December 12, 2006 | |
| INVENTOR(S) | : Christopher S. Johnson | |

It is certified that error appears in the above-identified patent and that said Letters Patent is hereby corrected as shown below:

Column 1, line 27, "decode a each" should read --decode each--.

Signed and Sealed this

Thirteenth Day of March, 2007

JON W. DUDAS
*Director of the United States Patent and Trademark Office*